US009791755B2

(12) United States Patent
Cao et al.

(10) Patent No.: US 9,791,755 B2
(45) Date of Patent: Oct. 17, 2017

(54) COLOR FILTER-ON-ARRAY SUBSTRATE, DISPLAY DEVICE, AND METHOD FOR MANUFACTURING THE COLOR FILTER-ON-ARRAY SUBSTRATE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Binbin Cao, Beijing (CN); Yinhu Huang, Beijing (CN); Jongwon Moon, Beijing (CN)

(73) Assignees: BOE TECHNOLOGY GROUP CO., LTD. (CN); HEFEI XINSHENG OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 15/130,066

(22) Filed: Apr. 15, 2016

(65) Prior Publication Data
US 2016/0334685 A1 Nov. 17, 2016

(30) Foreign Application Priority Data
May 15, 2015 (CN) .......................... 2015 1 0249892

(51) Int. Cl.
*G02F 1/1362* (2006.01)
*H01L 27/12* (2006.01)
*H01L 29/786* (2006.01)

(52) U.S. Cl.
CPC .. *G02F 1/136209* (2013.01); *G02F 1/136227* (2013.01); *H01L 27/124* (2013.01);
(Continued)

(58) Field of Classification Search
CPC ............... H01L 27/1225; H01L 27/124; H01L 27/1262; H01L 29/7869; H01L 23/5222;
(Continued)

(56) References Cited

U.S. PATENT DOCUMENTS

2014/0054581 A1* 2/2014 Song ................... G02F 1/1343
257/43
2014/0104527 A1 4/2014 Yang et al.
(Continued)

FOREIGN PATENT DOCUMENTS

CN 103325732 A 9/2013
CN 104090434 A 10/2014

OTHER PUBLICATIONS

First Office Action for Chinese Application No. 201510249892.3, dated Apr. 6, 2017, 6 Pages.

*Primary Examiner* — David Vu
*Assistant Examiner* — Mouloucoulaye Inoussa
(74) *Attorney, Agent, or Firm* — Brooks Kushman P.C.

(57) ABSTRACT

The present disclosure provides a COA substrate, a display device and a method for manufacturing the COA substrate. The COA substrate includes: a passivation layer pattern arranged on a first conductive layer pattern including a data line, and a source electrode and a drain electrode of a TFT, and including a first via-hole at a position corresponding to the drain electrode; a second conductive layer pattern arranged on the passivation layer pattern and including a conductive connection pattern arranged at a region defined by a gate line, the data line and the TFT, and connected to the drain electrode of the TFT through the via-hole; and a color filter layer pattern arranged on the second conductive layer pattern and including a second via-hole at a position corresponding to the conductive connection pattern.

16 Claims, 4 Drawing Sheets

(52) U.S. Cl.
CPC ...... *H01L 27/1225* (2013.01); *H01L 27/1262* (2013.01); *H01L 29/7869* (2013.01); *H01L 29/78633* (2013.01); *G02F 2001/136222* (2013.01); *G02F 2201/40* (2013.01)

(58) Field of Classification Search
CPC ........... H01L 29/78633; H01L 27/1248; H01L 27/1214; H01L 29/42384; H01L 29/4908; G02F 1/136227; G02F 1/136209
USPC .................................................. 349/106, 110
See application file for complete search history.

(56) References Cited

U.S. PATENT DOCUMENTS

| | | |
|---|---|---|
| 2015/0346546 A1 | 12/2015 | Hui |
| 2015/0380442 A1* | 12/2015 | Li ........................ H01L 27/1214 257/72 |

* cited by examiner

COLOR FILTER-ON-ARRAY SUBSTRATE, DISPLAY DEVICE, AND METHOD FOR MANUFACTURING THE COLOR FILTER-ON-ARRAY SUBSTRATE

CROSS-REFERENCE TO RELATED APPLICATION

The present application claims a priority of the Chinese Patent Application No. 201510249892.3 filed on May 15, 2015, which is incorporated herein by reference in its entirety.

TECHNICAL FIELD

The present disclosure relates to the manufacture of a display panel, in particular to a color filter-on-array (COA) substrate, a display device and a method for manufacturing the COA substrate.

BACKGROUND

A COA technology refers to a technology where a color filter layer is directly formed on an array substrate, and the resultant array substrate is called as COA substrate. For a COA display panel, it is unnecessary to align a color filter substrate with the array substrate, so it is able to prevent the occurrence of an error in the related art where the color filter substrate is arranged opposite to the array substrate to form a cell. At this time, a narrow black matrix may be provided, so as to improve an aperture ratio of a pixel.

However, along with the improvement of a resolution of a liquid crystal display device, a smaller size of a pixel unit for the display panel is required. In the related art, a via-hole in the color filter substrate is of a large size, so a size of a drain electrode of a transistor on the array substrate is relatively large too, and thereby the aperture ratio of the pixel will be adversely affected. In addition, light at a side of the via-hole may be reflected by the large drain electrode, and as a result, light leakage will occurs for the liquid crystal display device and a display effect thereof will be adversely affected.

SUMMARY

A main object of the present disclosure is to provide a COA substrate, a display device and a method for manufacturing the COA substrate, so as to reduce a size of a drain electrode, thereby to improve an aperture ratio of a pixel and effectively prevent the occurrence of light leakage due to the light reflected by the drain electrode.

In one aspect, the present disclosure provides in some embodiments a COA substrate, including a gate line and a data line crossing each other, and a thin film transistor (TFT). The COA substrate further includes: a passivation layer pattern arranged on a first conductive layer pattern including the data line, and a source electrode and a drain electrode of the TFT, and the passivation layer pattern including a first via-hole at a position corresponding to the drain electrode; a second conductive layer pattern arranged on the passivation layer pattern and including a conductive connection pattern arranged at a light-shielding region and connected to the drain electrode of the TFT through the via-hole, the light-shielding region being defined by the gate line, the data line and the TFT; and a color filter layer pattern arranged on the second conductive layer pattern and including a second via-hole at a position corresponding to the conductive connection pattern.

Alternatively, the COA substrate further includes a black matrix arranged between the passivation layer pattern and the second conductive layer pattern, and at a position within the light-shielding region apart from a position where the first via-hole is located.

Alternatively, the COA substrate further includes a pixel electrode layer pattern arranged on the color filter layer pattern and including a plurality of pixel electrodes connected to the conductive connection pattern through the second via-hole.

Alternatively, the second conductive layer pattern is made of indium tin oxide (ITO).

In another aspect, the present disclosure provides in some embodiments a display device including the above-mentioned COA substrate.

In yet another aspect, the present disclosure provides in some embodiments a method for manufacturing a COA substrate, including steps of forming a gate line and a first conductive layer pattern including a data line and a source electrode and a drain electrode a TFT. The method further includes steps of: forming a passivation layer pattern on the first conductive layer pattern, the passivation layer pattern including a first via-hole at a position corresponding to the drain electrode; forming a second conductive layer pattern on the passivation layer pattern, the second conductive layer pattern including a conductive connection pattern arranged at a light-shielding region and connected to the drain electrode of the TFT through the via-hole, the light-shielding region being defined by the gate line, the data line and the TFT; and forming a color filter layer pattern on the second conductive layer pattern, the color filter layer pattern including a second via-hole at a position corresponding to the conductive connection pattern.

Alternatively, subsequent to the step of forming the passivation layer pattern on the first conductive layer pattern and prior to the step of forming the second conductive layer pattern on the passivation layer pattern, the method further includes forming a black matrix at a position within the light-shielding region apart from a position where the first via-hole is located.

Alternatively, subsequent to the step of forming the second conductive layer pattern, the method further includes forming a pixel electrode layer pattern on the color filter layer pattern, and the pixel electrode layer pattern includes a plurality of pixel electrodes connected to the conductive connection pattern through the second via-hole.

According to the COA substrate, the display device and the method for manufacturing the COA substrate in the embodiments of the present disclosure, the color filter layer pattern includes the large second via-hole at a position corresponding to the conductive connection pattern, and this large second via-hole is arranged above the conductive connection pattern, so a size of the conductive connection pattern, rather than a size of the drain electrode, depends on the size of the second via-hole, and thereby it is able to reduce the size of the drain electrode. In addition, the conductive connection pattern is arranged at a region defined by the gate line, the data line and the TFT, so there is a sufficient space to arrange the second via-hole. At this time, it is unnecessary to increase the size of the drain electrode, and as a result, it is able to reduce the light-shielding region and improve the aperture ratio of the pixel as compared with the related art. Moreover, because it is unnecessary to increase the size of the drain electrode, it is able to reduce the light leakage somewhat due to the light reflected by the drain electrode, thereby to improve the display effect.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to apart of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
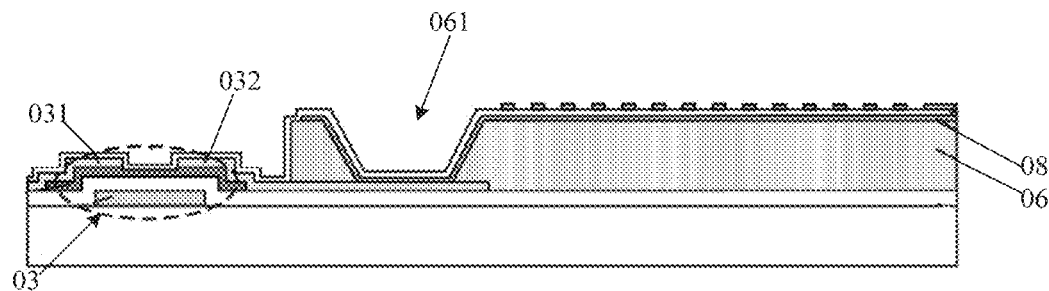
FIG. 1 is a sectional view of a COA substrate.

FIG. 1 shows a COA substrate. A thin film transistor (TFT) 03, a color filter layer 06 and a pixel electrode 08 are sequentially formed on a transparent substrate. The TFT 03 includes a source electrode 031 and a drain electrode 032. A via-hole 061 penetrating through the color filter layer 06 is arranged above the drain electrode 032 of the TFT 03, and the pixel electrode 08 is electrically connected to the drain electrode 032 through the via-hole 061. Usually, the via-hole 061 is of a relatively large size, so the drain electrode is of a large size too, and thereby an aperture ratio of a pixel will be adversely affected. In addition, light leakage may easily occur for a liquid crystal display device when light at a side of the via-hole 061 is reflected by the large drain electrode, and thereby a display effect of the liquid crystal display device will be adversely affected.

Figure 2:
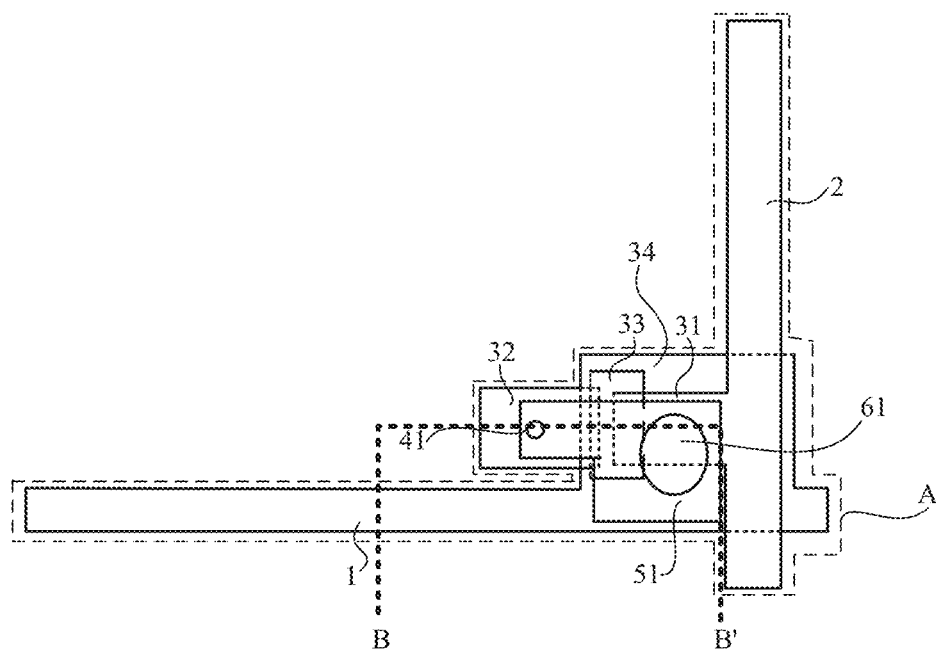
FIG. 2 is a top view of a COA substrate according to one embodiment of the present disclosure.
Figure 3:
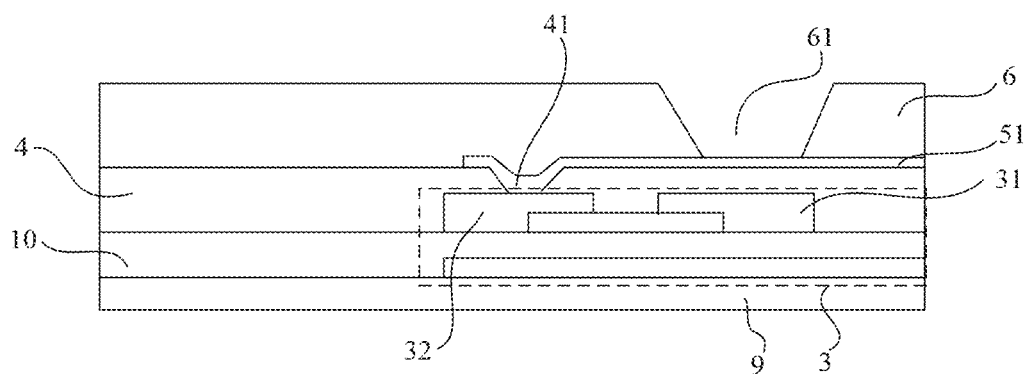
FIG. 3 is a sectional view of the COA substrate along line BB' in FIG. 2.

In view of above, the present disclosure provides a COA substrate which, as shown in FIGS. 2 and 3, includes a gate line 1 and a data line 2 crossing each other, a TFT 3, and a passivation layer pattern 4 arranged on a first conductive layer pattern including the data line 2, a source electrode 31 and a drain electrode 32 of the TFT 3. The passivation layer pattern 4 includes a first via-hole 41 at a position corresponding to the drain electrode 32. Here, the phrase "corresponding to" refers to that the drain electrode 32 overlaps the first via-hole 41 as viewed, in a direction perpendicular to a transparent substrate 9 (i.e., a direction perpendicular to the paper in FIG. 2, or a longitudinal direction in FIG. 3). Usually, a projection of the first via-hole 41 onto the transparent substrate 9 is located within a region where a projection of the drain electrode 32 onto the transparent substrate 9 is located, so as to enable the drain electrode 32 to be connected to the other pattern through the first via-hole 41. In the embodiments of the present disclosure, the drain electrode 32 needs to be connected to the conductive connection pattern 51 which will be described hereinafter.

In the embodiments of the present disclosure, patterns obtained by patterning a first conductive layer are collectively called as the first conductive layer pattern. Usually, a patterning process may include masking, exposing and developing, and of course, it may further include etching and removing. It should be appreciated that, apart from the data line 2, the source electrode 31 and the drain electrode 32, the first conductive layer pattern may further include any other patterns according to the practical need, e.g., a lead for the data line.

As shown in FIGS. 2 and 3, the COA substrate further includes a second conductive layer arranged on the passivation layer pattern 4. The second conductive layer pattern includes a conductive connection pattern 51 arranged at a light-shielding region A and connected to the drain electrode 32 of the TFT 3 through the first via-hole 41. The light-shielding region A is defined by the gate line 1, the data line 2 and the TFT 3. It should be appreciated that, a boundary of the light-shielding region A may coincide with boundaries of the gate line 1, the data line 2 and the TFT 3, or as shown in FIG. 2, may be slightly shifted outward from the boundaries of the gate line 1, the data line 2 and the TFT 3.

In the embodiments of the present disclosure, patterns obtained by patterning a second conductive layer are collectively called as the second conductive layer pattern. Usually, a patterning process may include masking, exposing and developing, and of course, it may further include etching and removing. It should be appreciated that, apart from the conductive connection pattern 51 arranged at the light-shielding region A and connected to the drain electrode 32 of the TFT 3 through the first via-hole 41, the second conductive layer pattern may further include any other patterns.

Because the conductive connection pattern 5 is located at the light-shielding region A, it may be transparent or nontransparent. When the second conductive layer pattern merely includes the conductive connection pattern 51, it may be made of a nontransparent or transparent material. When the second conductive layer pattern further includes any other pattern, it may be made of a material capable of satisfy a light-transmittable requirement of the other pattern.

The COA substrate further includes a color filter layer pattern 6 arranged on the second conductive layer pattern and including a second via-hole 61 at a position corresponding to the conductive connection pattern 51. Here, the phrase "corresponding to" refers to that the conductive connection pattern 51 overlaps the second via-hole 61 as viewed in a direction perpendicular to the transparent substrate 9. Usually, a projection of the second via-hole 61 onto the transparent substrate 9 is located within a region where a projection of the conductive connection pattern 51 onto the transparent substrate 9 is located, so as to enable the conductive connection pattern 51 to be connected to the other pattern through the second via-hole 61.

The gate line 1 and the data line 2 may be made of a metal material, and the source electrode 31 and the drain electrode 32 of the TFT 3 may also be made of a metal material. The passivation layer pattern 4 may be made of an insulating material such as SiNx or a transparent resin material. The second conductive connection pattern may be made of indium tin oxide (ITO). Due to such advantages of ITO as high conductivity and high light transmittance, alternatively, the second conductive layer pattern is made by ITO.

It should be appreciated that, on one hand, usually the passivation layer pattern is made of SiNx, SiOx or Si(ON)x, so the first via-hole 41 in the passivation layer pattern may be shrunk during the formation. In addition, the color filter pattern 6 is usually made of a color resin material, and the second via-hole 61 in the color filter layer pattern 6 may not be shrunk during the formation. Hence, the second via-hole 61 is of a pore size greater than the first via-hole 41. On the other hand, a thickness of the passivation layer pattern 4 may be set in accordance with the practical need, as long as the two layers on and under the passivation layer pattern 4 are insulated from each other at a region other than the via-hole. Usually, in the case that the passivation layer pattern 4 may function as an insulation layer, the smaller its thickness, the better. Generally, the color filter layer pattern 6 is of a thickness greater than the passivation layer pattern 4. When forming the second via-hole 61 in the color filter layer pattern 6 and forming the first via-hole 41 in the passivation layer pattern 4, the color filter layer pattern 6 needs to be etched at an intensity greater than the passivation layer pattern 4, so the second via-hole 61 may be of a pore size larger than the first via-hole 41. Based on the above, the pore size of the second via-hole 61 is greater than that of the first via-hole 41.

To be specific, the passivation layer pattern 4 includes the first via-hole 41 at a position corresponding to the drain electrode 32, and the conductive connection pattern 51 is electrically connected to the drain electrode 32 of the TFT 3 through the first via-hole 41. The color filter layer pattern 6 includes the second via-hole 61 at a position corresponding to the conductive connection pattern 51, and the second via-hole 61 is of a pore size larger than the first via-hole 41. When the second via-hole 61 is arranged above the conductive connection pattern 51, it is able to reduce the size of the drain electrode 32. In addition, through the above structure, it is also able to electrically connect the patterns above the color filter layer pattern 6 to the drain electrode 32 through the second via-hole 61, the conductive connection pattern 51 and the first via-hole 41.

According to the COA substrate in the embodiments of the present disclosure, the color filter layer pattern 6 includes the large second via-hole 61 at a position corresponding to the conductive connection pattern 51, and this large second via-hole 61 is arranged above the conductive connection pattern 51, so a size of the conductive connection pattern 51, rather than a size of the drain electrode 32, depends on the size of the second via-hole 61, and thereby it is able to reduce the size of the drain electrode 32. In addition, the conductive connection pattern 51 is arranged at a region defined by the gate line 1, the data line 2 and the TFT 3, so there is a sufficient space to arrange the second via-hole 61. At this time, it is unnecessary to increase the size of the drain electrode 32, and as a result, it is able to reduce the light-shielding region and improve the aperture ratio of the pixel as compared with the related art. Moreover, because it is unnecessary to increase the size of the drain electrode 32, it is able to reduce the light leakage somewhat due to the light reflected by the drain electrode 32, thereby to improve the display effect.

It should be appreciated that, a black matrix 7 is usually arranged on the gate line 1, the data line 2, the source electrode 31 and the drain electrode 32 of the TFT 3, so as to shield the light. Of course, in the embodiments of the present disclosure, the black matrix 7 may be provided or not provided, which is not particularly defined herein.

Figure 4:
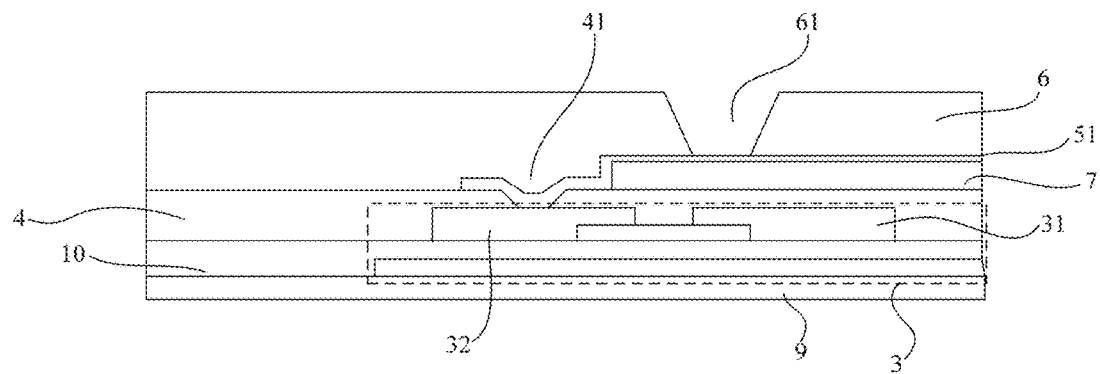
FIG. 4 is another sectional view of the COA substrate with a black matrix according to one embodiment of the present disclosure.

Alternatively, as shown in FIG. 4, the COA substrate further includes the black matrix 7 arranged between the passivation layer pattern 4 and the second conductive layer pattern, and at a position within the light-shielding region apart from a position where the first via-hole is located.

It should be appreciated that, usually the passivation layer pattern 4 is relatively thin, and when the second conductive layer pattern is directly arranged on the passivation layer pattern 4, there is a relatively large coupling capacitance between the TFT 3 and the second conductive layer pattern. As a result, signal delay may occur and an image may be displayed abnormally. In the embodiments of the present disclosure, the black matrix 7 is made of an insulating, black resin material, and through the black matrix 7, it is able to reduce the coupling capacitance between the source electrode 31 of the TFT 3 and the second conductive layer pattern, thereby to prevent the occurrence of the signal delay and improve the image quality. In addition, as compared with the related art where the color filter layer 6 and the black matrix 7 are arranged on a color filter substrate, it is unnecessary for the COA substrate in the embodiments of the present disclosure to take into consideration an error caused when the color filter substrate is arranged opposite to the array substrate to form a cell. Hence, in the case that such structures to be shielded as the gate line 1, the data line 2 and the TFT 3 are shielded by the black matrix 7, it is able to appropriately reduce a width of the black matrix 7 thereby to improve the aperture ratio.

Of course, when the black matrix 7 is not provided, the light may also be shielded by the gate line 1, the data line 2, the source electrode 31 and the drain electrode 32 of the TFT 3, so as to improve the aperture ratio.

Figure 5:
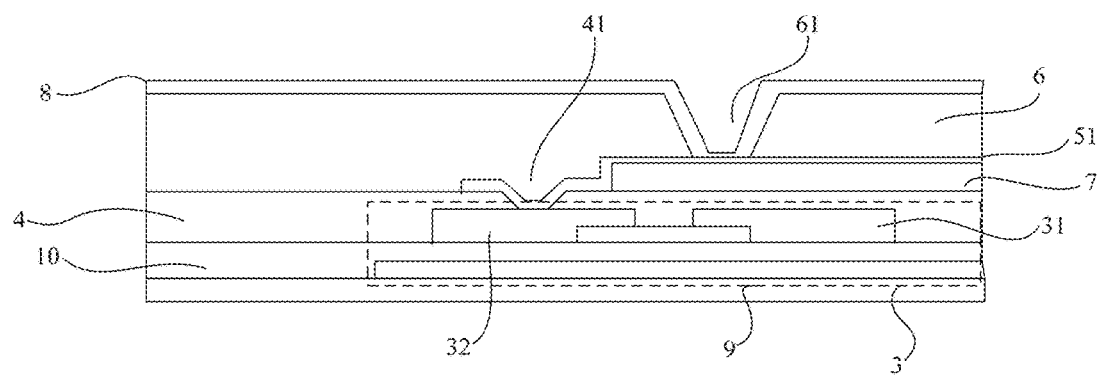
FIG. 5 is yet another sectional view of the COA substrate with a pixel electrode layer pattern according to one embodiment of the present disclosure.

It should be appreciated that, merely the contents related to an inventive point of the present disclosure are described herein. The contents irrelevant to the inventive point are known in the related art, and thus are omitted or described briefly. For example, any other patterns, such as a pixel electrode layer pattern and a common electrode layer pattern, may also be arranged on the color filter layer pattern 6. Alternatively, as shown in FIG. 5, the COA substrate further includes a pixel electrode layer pattern arranged on the color filter layer pattern 6 and including a plurality of pixel electrodes 8 electrically connected to the conductive connection pattern 51 through the second via-hole 61. Of course, a common electrode layer pattern may also be arranged on the color filter layer pattern 6, which will not be particularly defined herein.

Usually, the color filter layer pattern 6 is made of an insulating resin material. The pixel electrode 8 is electrically connected to the conductive connection pattern 51 through the second via-hole 61, and the conductive connection pattern 51 is electrically connected to the drain electrode 32 of the TFT 3 through the first via-hole 41. Hence, the pixel electrode 8 is electrically connected to the drain electrode 32 of the TFT 3 through the conductive connection pattern 51.

The present disclosure further provides in some embodiments a display device including the above-mentioned COA substrate. The display device may be any product or member having a display function, such as a mobile phone, a flat-panel computer, a television, a display, a laptop computer, a digital photo frame or a navigator. The implementation of the display device may refer to those mentioned above, and thus will not be repeated herein.

The present disclosure further provides in some embodiments a method for manufacturing the COA substrate, which includes the following steps.

1. Forming the gate line, the data line and the TFT.

Figure 6:
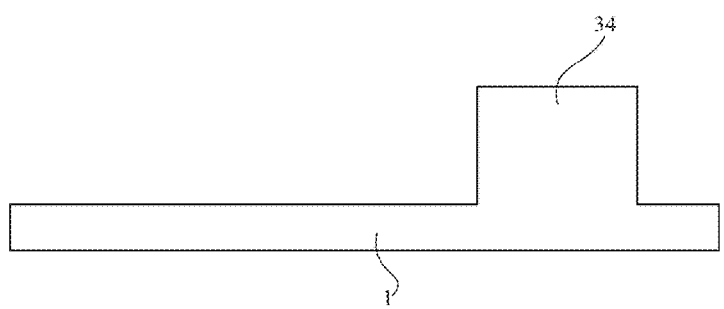
FIG. 6 is a top view of a transparent substrate with a gate line and a gate electrode according to one embodiment of the present disclosure.

At first, the gate line, and the first conductive layer pattern including the data line, the source electrode and the drain electrode of the TFT may be formed. To be specific, as shown in FIG. 6, a metal film may be deposited onto a substrate, e.g., a glass substrate or a quartz substrate, by magnetron sputtering. The metal film may be made of Mo, Al, an Al—Ni alloy, a Mo—W alloy, Cr or Cu, or may consist of several layers made of the above-mentioned materials. Then, a photoresist may be applied onto the metal layer, and then exposed, developed, etched and removed by using a mask plate so as to form a gate metal layer pattern on the substrate. The gate metal layer pattern includes the gate line 1 and the gate electrode 34 extending from the an gate line.

Next, a gate insulation layer 10 (as shown in FIG. 3) is formed on the gate metal layer pattern. To be specific, a gate insulation film may be deposited onto the glass substrate by chemical vapor deposition or magnetron sputtering. The gate insulation film may be made of SiNx, SiOx or Si(ON)x.

Figure 7:
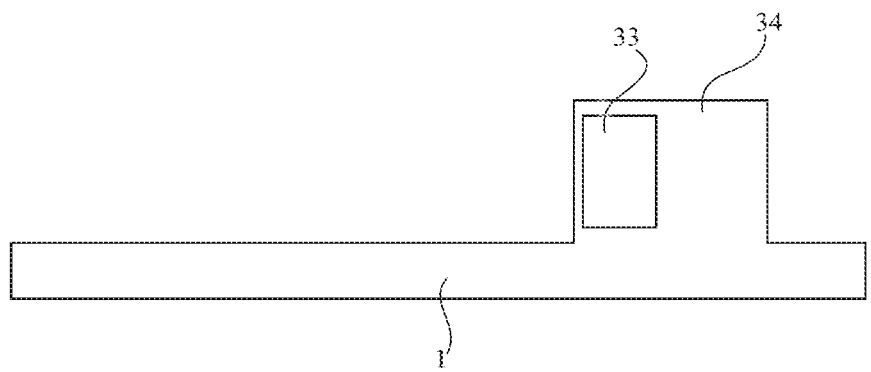
FIG. 7 is another top view of the transparent substrate with an active layer according to one embodiment of the present disclosure.

Then, an active layer may be formed on the gate insulation layer. To be specific, as shown in FIG. 7, a metal oxide semiconductor film may be deposited onto the gate insulation layer by chemical vapor deposition. A photoresist may be applied onto the metal oxide semiconductor film, and then exposed, developed and etched by a conventional mask plate, so as to form the active layer 33.

Figure 8:
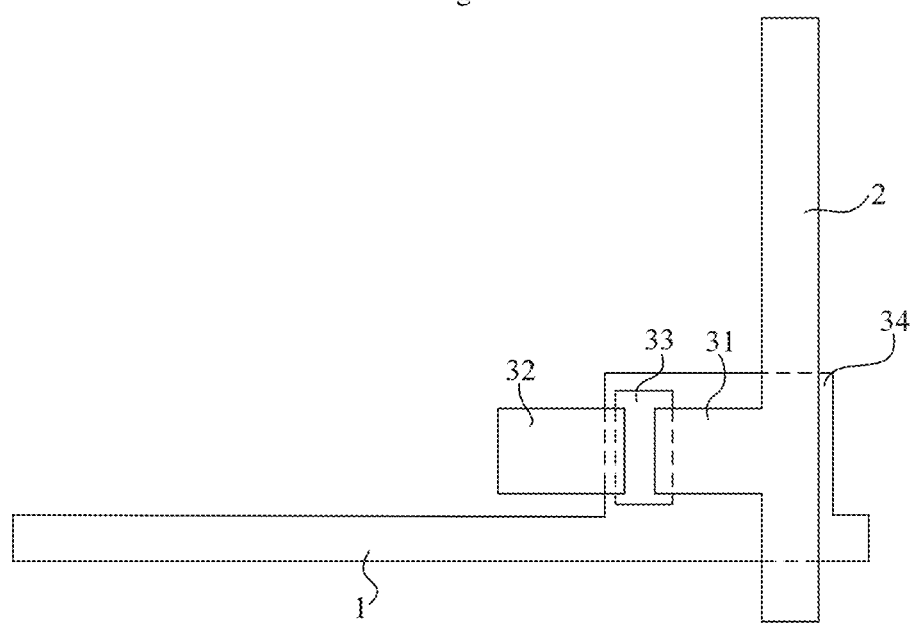
FIG. 8 is yet another top view of the transparent substrate with a data line, a source electrode and a drain electrode of a TFT according to one embodiment of the present disclosure.

Finally, as shown in FIG. 8, similar to the formation of the gate line 1, a metal layer similar to the gate metal may be deposited onto the substrate, and then patterned so as to form in a certain region the first conductive layer pattern (including the source electrode 31, the drain electrode 32 and the data line 2).

Figure 9:
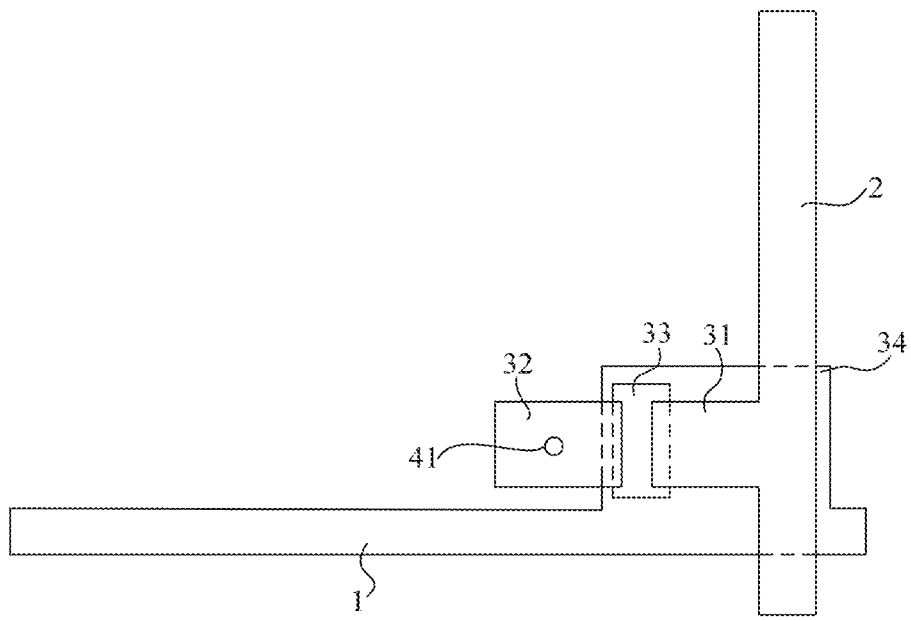
FIG. 9 is still yet another top view of the transparent substrate with a passivation layer pattern including a first via-hole at a position corresponding to the drain electrode according to one embodiment of the present disclosure.

2. Forming the passivation layer pattern on the first conductive layer pattern. As shown in FIG. 9, the passivation layer pattern includes the first via-hole 41 at a position corresponding to the drain electrode. To be specific, a passivation layer may be formed on the transparent substrate 9 with the first conductive layer pattern by a film-forming process such as sputtering, depositing or applying. The passivation layer may be made of SiNx, SiOx or Si(ON)x. A photoresist may then be applied onto the passivation layer, and then exposed and developed, or further etched and removed, using a mask plate, so as to form the passivation layer pattern including the first via-hole 41 at a position corresponding to the drain electrode.

Figure 10:
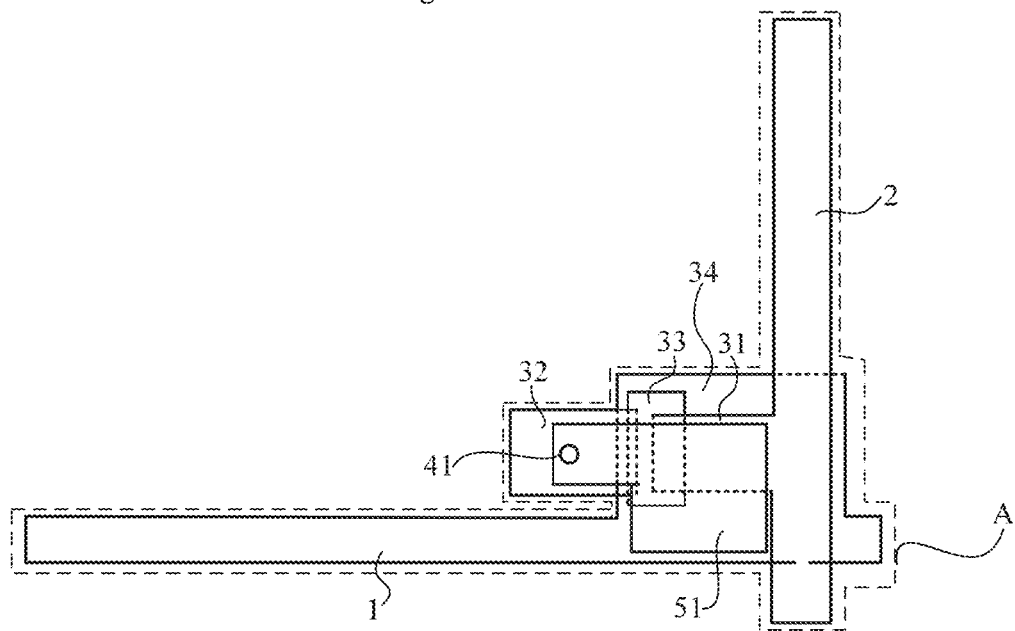
FIG. 10 is still yet another top view of the transparent substrate with a conductive connection pattern arranged at a light-shielding region and electrically connected to the drain electrode according to one embodiment of the present disclosure.

3. Forming the second conductive layer pattern on the passivation layer pattern. To be specific, a conductive layer may be applied onto the passivation layer pattern, and it may be made of ITO. Then, a photoresist may be applied onto the conductive layer, and then exposed, developed, etched and removed using a mask plate, so as to form the second conductive layer pattern. As shown in FIG. 10, the second conductive layer pattern includes the conductive connection pattern 51 arranged at the light-shielding region A and connected to the drain electrode 32 of the TFT through the first via-hole 41. The light-shielding region A is defined by the gate line 1, the data line 2 and the TFT.

4. Forming the color filter layer pattern on the second conductive layer pattern. As shown in FIGS. 2 and 3, the color filter layer pattern 6 includes the second via-hole 61 at a position corresponding to the conductive connection pattern 51. To be specific, a color filter film may be applied onto the transparent substrate 9 with the second conductive layer pattern. The color filter layer pattern may include red, blue and green patterns, and of course, it may further include a white pattern. Then, the second via-hole 61 may be formed by a patterning process in the color filter layer pattern at a position corresponding to the conductive connection pattern 51 so as to form the color filter layer pattern. Alternatively, a mask plate used for forming any one or more primary-color patterns may be changed, so as to form the second via-hole 61 while forming the primary-color patterns.

According to the method for manufacturing the COA substrate in the embodiments of the present disclosure, the color filter layer pattern 6 includes the large second via-hole 61 at a position corresponding to the conductive connection pattern 51, and this large second via-hole 61 is arranged above the conductive connection pattern 51, so a size of the conductive connection pattern 51, rather than a size of the drain electrode 32, depends on the size of the second via-hole 61, and thereby it is able to reduce the size of the drain electrode 32. In addition, the conductive connection pattern 51 is arranged at a region defined by the gate line 1, the data line 2 and the TFT 3, so there is a sufficient space to arrange the second via-hole 61. At this time, it is unnecessary to increase the size of the drain electrode 32, and as a result, it is able to reduce the light-shielding region and improve the aperture ratio of the pixel as compared with the related art. Moreover, because it is unnecessary to increase the size of the drain electrode 32, it is able to reduce the light leakage somewhat due to the light reflected by the drain electrode 32, thereby to improve the display effect.

In order to reduce the coupling capacitance between the first conductive layer pattern and the second conductive layer pattern and improve the image quality, alternatively, as shown in FIG. 4, subsequent to the step of forming the passivation layer pattern 4 on the first conductive layer pattern and prior to the step of forming the second conductive layer pattern on the passivation layer pattern 4, the method further includes forming the black matrix 7 at a position within the light-shielding region apart from a position where the first via-hole 41 is located. To be specific, a black resin film may be applied onto the conductive connection pattern. Then, a photoresist may be applied onto the black resin film, and then exposed and developed using a conventional mask plate, so as to form the black matrix 7 as shown in FIG. 4.

Alternatively, subsequent to the step of forming the second conductive layer pattern, the method further includes forming a pixel electrode layer pattern on the color filter layer pattern. As shown in FIG. 5, the pixel electrode layer pattern includes a plurality of pixel electrodes 8 connected to the conductive connection pattern 51 through the second via-hole 61. To be specific, an ITO film may be deposited onto the color filter layer pattern by magnetron sputtering. A photoresist may be applied onto the ITO film, and then exposed, developed and etched to form the pixel electrode layer pattern.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A color filter-on-array (COA) substrate, comprising a gate line and a data line crossing each other, and a thin film transistor (TFT), wherein the COA substrate further comprises:
   a passivation layer pattern arranged on a first conductive layer pattern comprising the data line, a source electrode, and a drain electrode of the TFT, the passivation layer pattern comprising a first via-hole at a position corresponding to the drain electrode;
   a second conductive layer pattern arranged on the passivation layer pattern and comprising a conductive connection pattern arranged at a light-shielding region and connected to the drain electrode of the TFT through the via-hole, the light-shielding region being defined by the gate line, the data line, and the TFT, and a whole projection of the conductive connection pattern on a base substrate of the COA substrate is located within a projection of the light-shielding region on the base substrate; and
   a color filter layer pattern arranged on the second conductive layer pattern and comprising a second via-hole at a position corresponding to the conductive connection pattern.

2. The COA substrate according to claim 1, further comprising a black matrix arranged between the passivation layer pattern and the second conductive layer pattern, and at a position within the light-shielding region apart from a position where the first via-hole is located.

3. The COA substrate according to claim 1, further comprising a pixel electrode layer pattern arranged on the color filter layer pattern and comprising a pixel electrode connected to the conductive connection pattern through the second via-hole.

4. The COA substrate according to claim 1, wherein the second conductive layer pattern is made of indium tin oxide (ITO).

5. A display device, comprising the color filter-on-array (COA) substrate according to claim 1.

6. The display device according to claim 5, wherein the display substrate further comprises a black matrix arranged between the passivation layer pattern and the second conductive layer pattern, and at a position within the light-shielding region apart from a position where the first via-hole is located.

7. The display device according to claim 5, wherein the COA substrate further comprises a pixel electrode layer pattern arranged on the color filter layer pattern and comprising a pixel electrode connected to the conductive connection pattern through the second via-hole.

8. The display device according to claim 5, wherein the second conductive layer pattern is made of indium tin oxide (ITO).

9. A method for manufacturing a color filter-on-array (COA) substrate, comprising steps of forming a gate line and a first conductive layer pattern comprising a data line, a source electrode, and a drain electrode of a thin film transistor (TFT), wherein the method further comprises steps of:
   forming a passivation layer pattern on the first conductive layer pattern, the passivation layer pattern comprising a first via-hole at a position corresponding to the drain electrode;
   forming a second conductive layer pattern on the passivation layer pattern, the second conductive layer pattern comprising a conductive connection pattern arranged at a light-shielding region and connected to the drain electrode of the TFT through the via-hole, the light-shielding region being defined by the gate line, the data line, and the TFT, and a whole projection of the conductive connection pattern on a base substrate of the COA substrate is located within a projection of the light-shielding region on the base substrate; and
   forming a color filter layer pattern on the second conductive layer pattern, the color filter layer pattern comprising a second via-hole at a position corresponding to the conductive connection pattern.

10. The method according to claim 9, wherein subsequent to the step of forming the passivation layer pattern on the first conductive layer pattern and prior to the step of forming the second conductive layer pattern on the passivation layer pattern, the method further comprises forming a black matrix at a position within the light-shielding region apart from a position where the first via-hole is located.

11. The method according to claim 9, wherein subsequent to the step of forming the second conductive layer pattern, the method further comprises forming a pixel electrode layer pattern on the color filter layer pattern, and the pixel electrode layer pattern comprises a plurality of pixel electrodes connected to the conductive connection pattern through the second via-hole.

12. The COA substrate according to claim 1, wherein at least part of the projection of the conductive connection pattern on the base substrate is located within the projection of the light-shielding region and out of a projection of the TFT on the base substrate.

13. A color filter-on-array (COA) substrate, comprising a gate line and a data line crossing each other, and a thin film transistor (TFT), wherein the COA substrate further comprises:
   a passivation layer pattern arranged on a first conductive layer pattern comprising the data line, a source electrode, and a drain electrode of the TFT, and the passivation layer pattern comprising a first via-hole at a position corresponding to the drain electrode;
   a second conductive layer pattern arranged on the passivation layer pattern and comprising a conductive connection pattern arranged at a light-shielding region and connected to the drain electrode of the TFT through the via-hole, the light-shielding region being defined by the gate line, the data line and the TFT;

a color filter layer pattern arranged on the second conductive layer pattern and comprising a second via-hole at a position corresponding to the conductive connection pattern; and a black matrix arranged between the passivation layer pattern and the second conductive layer pattern, and at a position within the light-shielding region apart from a position where the first via-hole is located, wherein a whole projection of the conductive connection pattern on a base substrate of the COA substrate is located within projections of the TFT and the black matrix on the base substrate.

14. The COA substrate according to claim 13, wherein at least part of the projection of the conductive connection pattern on the base substrate is located within the projection of the light-shielding region and out of a projection of the TFT on the base substrate.

15. The COA substrate according to claim 13, further comprising a pixel electrode layer pattern arranged on the color filter layer pattern and comprising a pixel electrode connected to the conductive connection pattern through the second via-hole.

16. The COA substrate according to claim 13, wherein the second conductive layer pattern is made of indium tin oxide (ITO).

* * * * *